US005764309A

United States Patent [19]
Krishnamurthy et al.

[11] Patent Number: 5,764,309
[45] Date of Patent: Jun. 9, 1998

[54] SYNC COMPENSATED AGC SYSTEM FOR VSB RECEIVER

[75] Inventors: Gopalan Krishnamurthy, Wheeling; Rudolf Turner, Hawthorn Woods, both of Ill.

[73] Assignee: Zenith Electronics Corporation, Glenview, Ill.

[21] Appl. No.: 726,597

[22] Filed: Oct. 7, 1996

[51] Int. Cl.[6] .................................................. H04N 5/52
[52] U.S. Cl. .................... 348/678; 348/682; 375/345; 455/234.1; 455/254; 330/278
[58] Field of Search .................. 348/678, 682, 348/725, 727, 474, 475; 375/345, 231; 455/234.1, 254; 330/278; H04N 5/52, 5/455

[56] References Cited

U.S. PATENT DOCUMENTS

| 4,625,240 | 11/1986 | Yablonski et al. | 358/143 |
|---|---|---|---|
| 5,267,272 | 11/1993 | Cai | 375/98 |
| 5,508,748 | 4/1996 | Krishnamurthy et al. | 348/475 |
| 5,565,932 | 10/1996 | Citta et al. | 348/678 |
| 5,636,250 | 6/1997 | Scarpa | 375/321 |
| 5,659,582 | 8/1997 | Kojima et al. | 375/345 |

Primary Examiner—Glenton B. Burgess

[57] ABSTRACT

A technique and apparatus for developing AGC voltage in a receiver capable of receiving VSB signals that do not have the average magnitudes of the data symbol levels and the sync symbol levels related so as to produce the same average level. One technique eliminates the sync symbols from determination of the AGC voltage. A preferred technique corrects for the different symbol levels of the sync by multiplexing in an offset at the proper time or multiplying the sync symbols by a compensating factor.

8 Claims, 1 Drawing Sheet

5,764,309

SYNC COMPENSATED AGC SYSTEM FOR VSB RECEIVER

CROSS REFERENCE TO RELATED PATENTS AND APPLICATIONS

This invention is related to U.S. Pat. No. 5,508,748, entitled DATA LEVEL SELECTION FOR MULTILEVEL VSB TRANSMISSION SYSTEM, which is hereby incorporated by reference and application Ser. No. 08/726,501, filed Oct. 7, 1996, entitled DATA COMPARISON AGC SYSTEM FOR VSB RECEIVER, both of which are assigned to the Zenith Electronics Corporation.

BACKGROUND OF THE INVENTION AND PRIOR ART

This invention relates to VSB (vestigial sideband) signal systems and specifically to methods and apparatus for developing AGC (automatic gain control) voltages in digital VSB signals.

The recently adopted standards for digital VSB terrestrial signals establishes certain data and sync symbol levels. In the ATSC (Advanced Television Systems Committee) document, the data levels to be used for the 8VSB (trellis coded) and 16VSB (ATSC) transmission systems are specified. The VSB transmission system is not restricted to over-the-air (terrestrial) transmission and Zenith Electronics Corporation has specified three more modes that can be used for cable or MMDS systems. These VSB modes are identified as 8/4/2 VSB cable modes. The two 8VSB modes differ only in the amount of data that is carried. As fully discussed in the above-mentioned patent, the data levels and sync levels in the various VSB cable modes may be selected to bear a desired relationship to each other, which results in great simplification and reduced cost in data slicing and error correction. This relationship also enables ready production of AGC voltages from the VSB signal. Unfortunately, that desired relationship is not present during the bilevel segment sync and frame sync of the standards adopted by the ATSC and need not be present in VSB signals that may be used.

With the desired relationship, the average value of the magnitude of the data symbols and the average value of the magnitude of the sync symbols are the same. In some of the signals mentioned, that relationship is not present as the average of the magnitude of data levels is not the same as the average of the magnitude of reference sync levels. Therefore the production of AGC potentials based upon data and sync amplitude averaging is prone to error.

The present invention solves the problems created by the undesired relationship between sync and data for AGC generation in a number of ways and enables a VSB receiver to generate AGC voltages for all VSB mode signals in a relatively simple manner.

OBJECTS OF THE INVENTION

A principal object of the invention is to provide a novel VSB receiver.

Another object of the invention is to provide a VSB receiver that can readily produce AGC voltages for all VSB mode signals in a simple manner.

A further object of the invention is to provide a novel method and apparatus for generating AGC voltages for VSB mode signals.

BRIEF DESCRIPTION OF THE DRAWING

These and other objects and advantages of the invention will be apparent upon reading the following description thereof in conjunction with the drawing, in which.

DESCRIPTION OF THE PREFERRED EMBODIMENT

Figure 1:
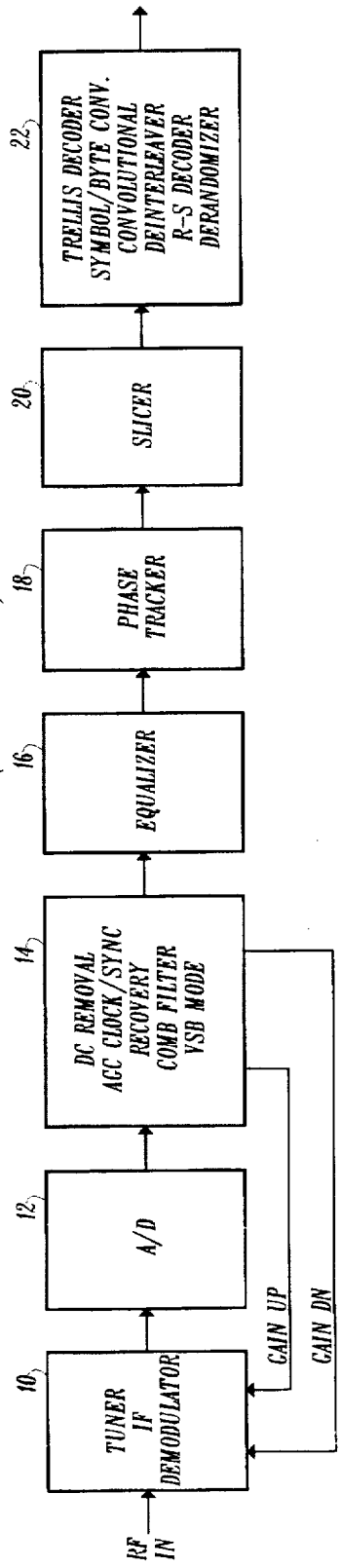
FIG. 1 is a simplified partial block diagram of a prior art VSB receiver.

Referring to FIG. 1, an RF signal (which may be cable or over-the-air) is applied to a tuner IF and demodulator 10 where it is processed in a well known manner to develop a baseband analog signal. The demodulated signal is converted to digital form in an A/D (analog-to-digital) converter 12 and applied to a block 14 that includes appropriate circuitry for removing DC, developing gain up and gain down AGC voltages, recovering clock information and sync signals, operating a comb filter and developing a VSB mode signal. The VSB mode of the received signal is also determined at this point. The signal is applied to an equalizer 16 that in turn supplies a phase tracker 18, which is operated in accordance with the teachings of U.S. Pat. No. 5,406,587, entitled ERROR TRACKING LOOP. The phase tracker supplies a slicer 20 that operates as described in the above-mentioned patent to recover the symbols in the received signal. Slicer 20 feeds a block 22 that includes a symbol/byte converter, convolutional deinterleaver circuitry, a trellis decoder, an R-S decoder and a derandomizer, all of which are well known in the art. The output data is applied to well known television or data processing circuitry (not shown) for display/use of the data.

Figure 2:
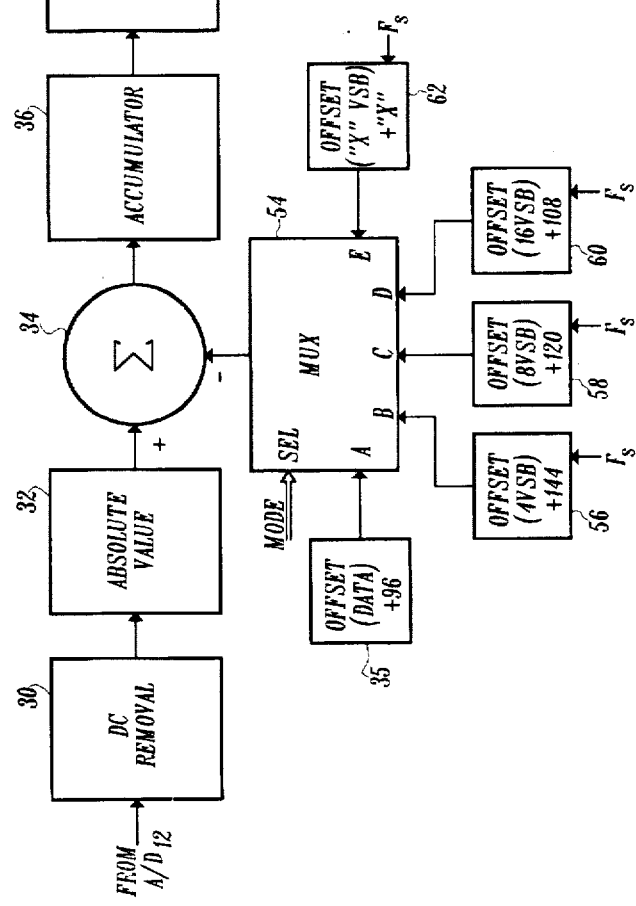
FIG. 2 is a block diagram of an AGC generation system for the circuit of FIG. 1 that embodies the invention.

FIG. 2 represents an AGC generation circuit constructed in accordance with the invention. The signal from A/D 12 is coupled to a DC removal circuit 30 where the DC due to the pilot and other DC offsets in the VSB signal are removed. The absolute value of the signal is taken in a circuit 32 and applied to a positive input of an adder 34. Adder 34 supplies the signal to an accumulator 36 that, in turn, supplies a flip/flop circuit 50 (that acts as a register). The output of flip/flop 50 is coupled to a pulse width modulator (PWM) 52 which generates the AGC voltage and activates either its Gain Up or Gain Down output. A series of offsets are produced by blocks 35, 56, 58, 60 and 62 and supplied to corresponding A, B, C, D and E inputs of a multiplexer 54 that is operated by a mode select bus. For the selected size of signal these offsets are +144 for a 4VSB signal, +120 for an 8VSB signal and +108 for a 16VSB signal. The output of multiplexer 54 is coupled to the negative input of adder 34.

In all VSB modes, the average of the data level symbols is 96 (for a selected size of the signal). This is also the average of the two-level sync symbols in the 2VSB signal, for example, and development of an AGC voltage by sampling all or portions of such a signal is not affected by whether the sync symbols are sampled along with the data symbols. For other signals where that relationship is not present, some compensation for the different level syncs should be made. It will be appreciated that the AGC voltage may be developed by sampling only the sync symbols; sampling only the data symbols; or sampling a combination of sync symbols and data symbols. The larger the portion of the signal that is sampled and averaged, the more accurate the AGC will be, but the slower it will be. Averaging shorter samples makes for a fast acting, albeit less accurate AGC.

In operation, the DC from the pilot and any other DC offsets are removed in DC removal circuit 30 and the absolute value of the remainder of the sampled signal is applied to adder 34 where it is combined with a selected one of the offsets from circuits 35, 56, 58, 60 and 62, by operation of multiplexer 54. The select operating signal for the multiplexer 54 is determined from the VSB mode of the signal and the type, i.e., whether the signal is cable or over-the-air. The mode bus selects the appropriate MUX input. During data portions of the signal input A of MUX 54 is selected. Other inputs are selected based upon the relationship of the sync and data levels in the other modes. The circuitry for determining the select signal is well known and is not part of the present invention. In signals where the desired relationship between the data symbol levels and the sync symbol levels is present, the data offset developed in block 35 is supplied at all times. This offset is indicated as being +96, which results in the level of the signal at the input to accumulator 36 being zero under ideal conditions. It will be appreciated that the offset values are based upon the particular signal levels and equipment employed and are not limiting of the invention. Should a 16VSB signal be received, the offset of +108 would be supplied by block 60 during the sync symbols and +96 during data symbols to compensate for the higher sync symbol levels. Should an 8VSB signal be received, an offset of +120 from block 58 would be subtracted from the sampled signal during sync time periods and +96 would be subtracted during data times. Similarly for a 4VSB signal, an offset of +144 would be subtracted during sync and +96 during data. A 2VSB signal obviously has the same sync and data levels and the offset of +96 would be subtracted during both sync and data. The offset in block 62 illustrates that the system is not limited to the signals discussed but may readily be extended to other VSB signals that share the common data levels, but include sync levels that differ from any of the discussed signals.

It will also be noted that timing signals may be used to completely eliminate the sync signals during the sampling. In such a system, the size of the sync symbols will not affect the derived average symbol level upon which the AGC voltage is based. This is one aspect of the invention, namely correcting for the differences in sync levels among the various VSB signals, as described, by eliminating all sync symbols from consideration in developing the AGC potential. This solution involves more elaborate timing circuits and may also involve some sacrifice in speed of the AGC.

The preferred implementation is to use the correct sync levels as indicated with the various offsets. In this implementation, the effect of the segment sync has been ignored since the segment sync occupies only a very small portion of a segment—unlike the frame sync.

It will also be appreciated that a multiplication technique may be used to correct for the sync symbol levels in the over-the-air VSB modes. Such a technique is similar to the adder arrangement shown, but would involve multiplying the sync symbol levels by an appropriate constant, dependent upon the type of signal received, to compensate for the error introduced by the sync levels.

What has been described is a novel method and apparatus for developing AGC potentials in a receiver that is capable of receiving different types of VSB signals in which the desired relationship between the data symbol levels and the sync symbol levels is not present. It is recognized that those skilled in the art will envision numerous changes in the described embodiments of the invention without departing from its true spirit and scope thereof. The invention is to be limited only as defined in the claims.

What is claimed is:

1. A method of operating an AGC system in a receiver that receives a plurality of digital signals having different average data symbol levels and average sync symbol levels, comprising:

processing a received signal to determine an average symbol level while precluding any differences in sync symbol level from affecting the determined average symbol level; and using the determined average symbol level to develop an AGC voltage.

2. A method of operating an AGC system in a receiver that receives a plurality of digital signals having a pilot and DC offsets and having different average data symbol levels and average sync symbol levels, comprising:

removing the DC pilot and DC offsets from the received signal;

processing the received signal to determine an average symbol level while precluding any differences in sync symbol level from affecting the determined average symbol level; and using the determined average symbol level to develop an AGC voltage.

3. The method of claim 2, wherein the average data symbol level differs from the average sync symbol level in the received signal, and further comprising:

adjusting the sync symbols to produce an average sync symbol level that corresponds to the average data symbol level.

4. The method of claim 2, wherein the average data symbol level differs from the average sync symbol level in the received signal and further comprising:

multiplying the sync symbols by a factor to bring the average sync symbol level into correspondence with the average data symbol level.

5. The method of claim 2, wherein the processing comprises:

using timing signals to only sample data symbols in the received signal.

6. A receiver for developing an AGC control voltage for any of a plurality of received digital signals that have different average data symbol levels and average sync symbol levels, comprising:

means for processing said received signals to determine an average symbol level;

means for precluding differences in said sync symbol levels from affecting said determined average symbol level; and means for using said determined average symbol level to develop said AGC potential.

7. A receiver for developing an AGC control voltage for any of a plurality of received digital signals that include a DC pilot and DC offsets and that have different average data symbol levels and average sync symbol levels, comprising:

means for removing DC pilot and said DC offsets from said received signals;

means for processing said received signals to determine an average symbol level;

means for precluding differences in said sync symbol levels from affecting said determined average symbol level; and means for using said determined average symbol level to develop said AGC potential.

8. The receiver of claim 7, wherein the average data symbol level differs from the average sync symbol level in said received signal, and further comprising:

means for adjusting said sync symbols of said received signal to produce correspondence between said average sync symbol level and said average data symbol level.

* * * * *